US011430615B2

(12) United States Patent
Rusev et al.

(10) Patent No.: US 11,430,615 B2
(45) Date of Patent: Aug. 30, 2022

(54) MULTIPLE HAMMER BLOW VACUUM INTERRUPTER WELD BREAKING

(71) Applicant: S&C Electric Company, Chicago, IL (US)

(72) Inventors: Tsvetan Rusev, Morton Grove, IL (US); Michael Stamer, Northbrook, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 16/744,806

(22) Filed: Jan. 16, 2020

(65) Prior Publication Data
US 2021/0134538 A1     May 6, 2021

Related U.S. Application Data

(60) Provisional application No. 62/799,404, filed on Jan. 31, 2019.

(51) Int. Cl.
*H01H 3/00* (2006.01)
*H01H 33/666* (2006.01)

(52) U.S. Cl.
CPC .......... *H01H 3/001* (2013.01); *H01H 33/666* (2013.01)

(58) Field of Classification Search
CPC .......... H01H 3/001; H01H 1/50; H01H 33/38; H01H 33/666; H01H 33/66207; H01H 51/2209; H01H 51/34; H01F 7/1844; H01F 7/18; H01F 2007/185; H01F 7/122; G01R 31/327; B60L 3/0046
USPC ............... 218/140, 120, 141, 146, 153, 154; 318/272
See application file for complete search history.

(56) References Cited

U.S. PATENT DOCUMENTS

| 3,597,713 | A | * | 8/1971 | McClain | H01H 73/38 335/171 |
| 3,920,941 | A | * | 11/1975 | Hundstad | H01H 33/666 218/140 |
| 4,384,185 | A | * | 5/1983 | Hall | H01H 33/56 200/61.08 |
| 5,462,172 | A |   | 9/1995 | Lane et al. | |

(Continued)

FOREIGN PATENT DOCUMENTS

EP     1772883 A1     11/2007

OTHER PUBLICATIONS

The International Search Report and the Written Opinion for International Application No. PCT/US2020/013853 dated Apr. 1, 2020. (11 pages).

*Primary Examiner* — William A Bolton

(57) ABSTRACT

A method for separating welded contacts in a magnetically actuated switch assembly that includes providing multiple actuator hammer blows to the contacts. The method includes causing the contacts to close using, for example, a manual actuation device and detecting a high current condition that occurs when the contacts are closed. The method further includes electrically actuating the actuator to open the contacts in response to detecting the high current condition and determining that the contacts have not opened in response to the actuator being actuated because they are welded together. The method also includes electrically actuating the actuator to close the contacts when it is determined that they are welded together and again electrically actuating the actuator to open the contacts.

9 Claims, 1 Drawing Sheet

(56) References Cited

U.S. PATENT DOCUMENTS

| | | | |
|---|---|---|---|
| 5,912,604 A * | 6/1999 | Harvey | H01H 33/6662 218/138 |
| 6,215,263 B1 | 4/2001 | Berkowitz et al. | |
| 7,215,228 B2 * | 5/2007 | Rhein | H01H 33/6662 335/6 |
| 7,911,303 B2 * | 3/2011 | Morita | H01H 33/6662 335/174 |
| 8,552,728 B2 | 10/2013 | Weiher | |
| 2015/0294807 A1 | 10/2015 | Benson, IV et al. | |

* cited by examiner

MULTIPLE HAMMER BLOW VACUUM INTERRUPTER WELD BREAKING

CROSS-REFERENCE TO RELATED APPLICATION

This application claims the benefit of priority from the U.S. Provisional Application No. 62/799,404, filed on Jan. 31, 2019, the disclosure of which is hereby expressly incorporated herein by reference for all purposes.

BACKGROUND

Field

This disclosure relates generally to a method for separating welded contacts in a switch and, more particularly, to a method for separating welded contacts in a magnetically actuated vacuum interrupter that includes providing multiple actuator hammer blows to the contacts.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be provided on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various distribution transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that increases the load on the network, which may cause the current flow from the substation to significantly increase, for example, several times above the normal current, along the fault path. This amount of current causes the electrical lines to significantly heat up and possibly melt, and also could cause mechanical damage to various components in the substation and in the network.

Power distribution networks of the type referred to above typically include a number of switching devices, breakers, reclosers, interrupters, etc. that control the flow of power throughout the network. A vacuum interrupter is a switch that has particular application for these types of devices. A vacuum interrupter employs opposing contacts, one fixed and one movable, positioned within a vacuum enclosure. When the interrupter is opened by moving the movable contact away from the fixed contact the arc that is created between the contacts is quickly extinguished by the vacuum. A vapor shield is provided around the contacts to contain the arcing. For certain applications, the vacuum interrupter is encapsulated in a solid insulation.

These types of vacuum interrupters are sometimes employed in fault interrupter devices, such as single-phase self-powered magnetically actuated reclosers. These types of magnetically actuated reclosers generally include a solenoid type actuator having an armature that is moved by an electrical winding to open and close the vacuum interrupter contacts, where the armature and a stator provide a magnetic path for the flux produced by the winding. The winding is de-energized after the actuator is moved to the open or closed position, and permanent magnets are used to hold the armature against a latching surface in both the open and closed position. Reclosers of this type automatically open the vacuum interrupter contacts in response to the detection of fault current, and are often coordinated with other reclosers and breakers so that the first recloser upstream of the fault is the only one that opens to limit the number of loads that do not receive power. When the recloser opens in response to detecting a fault, it will close shortly thereafter to determine if the fault remains. If the fault current is detected again, then the recloser will automatically open again and remain open.

It is sometimes desirable to provide a manual actuation device in connection with a magnetically actuated recloser of this type for manually closing and opening the vacuum interrupter contacts when no power is available to the recloser for electrically opening and closing the contacts. For example, when the recloser is first installed in a live circuit, such as on a utility pole, where the vacuum interrupter is in the open position, but power is not available because the contacts are open and unable to electrically close the vacuum interrupter, it is desirable for convenience purposes to be able to manually close the contacts. Further, the manual actuation device needs to be configured so that if a fault occurs in the circuit, or is present in the circuit when the vacuum interrupter is mechanically closed, the contacts will immediately open electrically as described above without the manual device interfering with the electrical operation of the actuator. Further, there may be occurrences where it is desirable to manually open the contacts when the vacuum interrupter is in operation without using the actuator.

There may be an occurrence where the contacts of a vacuum interrupter, breaker, recloser or other type of switch are welded closed because of high fault current. For example, an unknown fault may be on the line during the manual closing operation of a recloser of the type referred to above, where the vacuum interrupter is switched into the high fault current, which could cause the contacts to weld. If the weld cannot be removed by operating the actuator, then a farther upstream recloser will need to be opened to clear the fault.

SUMMARY

The following discussion discloses and describes a method for separating welded contacts in a magnetically actuated switch assembly that includes providing multiple actuator hammer blows to the contacts. The method includes causing the contacts to close using, for example, a manual actuation device and detecting a high current condition that occurs when the contacts are closed. The method further includes electrically actuating the actuator to open the contacts in response to detecting the high current condition and determining that the contacts have not opened in response to the actuator being actuated because they are welded together. The method also includes electrically actuating the actuator to close the contacts when it is determined that they are welded together and again electrically actuating the actuator to open the contacts.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a method for breaking welded contacts in a magnetically actuated switch assembly including a vacuum interrupter that includes providing multiple actuator hammer blows to the contacts is merely exemplary in nature, and is in no way intended to limit the disclosure or its applications or uses. For example, the discussion herein refers to the method being applicable to a vacuum interrupter. However, as will be appreciated by those skilled in the art, the method will have application for other types of switches.

Figure 1:
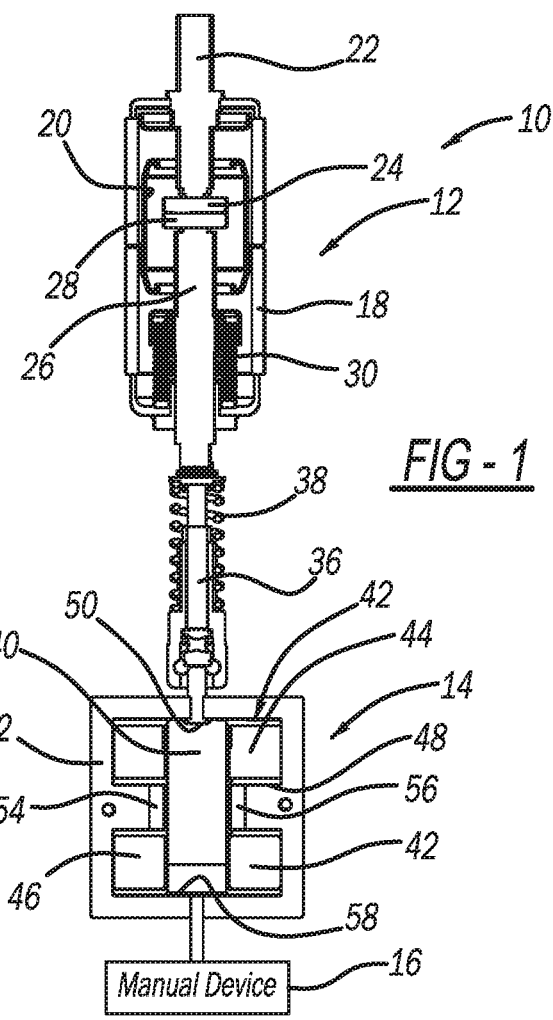
FIG. 1 is a side view of an internal portion of a magnetically actuated switch assembly including a vacuum interrupter.

FIG. 1 is a side view of a magnetic latching actuator operated switch assembly 10 including a vacuum interrupter 12, a solenoid or magnetic actuator 14 that electrically opens and closes the vacuum interrupter 12, and a manual actuation device 16 that manually opens and closes the vacuum interrupter 12, where an outer insulation housing of the vacuum interrupter 12 and an outer protective housing of the actuator 14 and the device 16 have been removed. The switch assembly 10 has particular application as a single-phase self-powered magnetically actuated fault recloser for use in medium voltage power distribution networks. The vacuum interrupter 12 includes an enclosure 18 defining a vacuum chamber 20, a fixed upper terminal 22 extending through a top end and into the chamber 20 and including a contact 24 and a movable lower terminal 26 extending through a bottom end and into the vacuum chamber 20 and including a contact 28, where a bellows 30 allows the movable terminal 26 to slide without affecting the vacuum in the chamber 20. The vacuum interrupter 12 is shown in the closed position where the contacts 24 and 28 are in contact with each other.

The switch assembly 10 further includes a dielectric drive rod 36 extending through a spring 38, where one end of the drive rod 36 is connected to the lower terminal 26 and an opposite end of the drive rod 36 is connected to an armature 40 in the actuator 14. When the switch assembly 10 is in an open state and the actuator 14 is commanded to close the vacuum interrupter 12, current flow is provided in one direction through a split winding 42 having an upper winding-half 44 and a lower winding-half 46 defining a space 48 therebetween, where a magnetic path is provided by the armature 40 and an E-shaped stator 52. In response, the armature 40 is drawn upward, which also moves the rod 36 and the lower terminal 26 upward so that the contact 28 engages the contact 24, where continued movement of the armature 40 to a closed latch position against a latch surface 50 compresses the spring 38 to increase the force of the contact 26 against the contact 24.

When the armature 40 is latched closed the winding 42 is de-energized and a pair of permanent magnets 54 and 56 positioned in the space 48 on opposite sides of the armature 40 hold the armature 40 in the closed latch position and the spring 38 under compression, where the actuator 14 is shown in the closed position in FIG. 1. When the switch assembly 10 is in the closed state and the actuator 14 is commanded to open the vacuum interrupter 12, current flow is provided in the opposite direction through the split winding 42 and the armature 40 is drawn downward with help from the spring 38. The rod 36 and the lower terminal 26 also move downward so that the contact 28 disengages the contact 24, where continued movement of the armature 40 proceeds to an open latch position against latch surface 58. The permanent magnets 54 and 56 also hold the armature 40 in the open latch position when the winding 42 is de-energized. No details of the device 16 are shown as it can be any mechanical device suitable for the purposes discussed herein.

Figure 2:
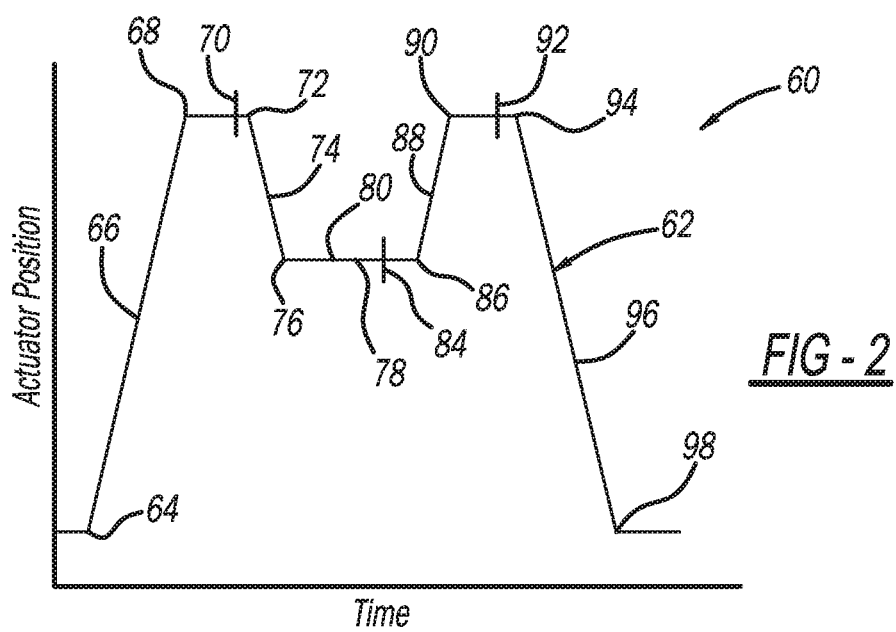
FIG. 2 is a timing diagram showing a technique for providing multiple hammer blows for separating welded contacts in the vacuum interrupter shown in FIG. 1.

FIG. 2 is a timing diagram 60 where time is on the horizontal axis and the position of the actuator 14, specifically the armature 40, is on the vertical axis, where graph line 62 shows the position of the actuator 14 between an open position and a closed position over time. At point 64, the actuator 14 is in the open latch position and a manual closing operation of the actuator 14 is initiated by the manual actuation device 16 to close the vacuum interrupter 12, for example, when the switch assembly 10 is first put into service or during subsequent maintenance, where the closing motion of the armature 40 occurs along line portion 66. Unknown to the operator who is manually closing the vacuum interrupter 12, the power line is faulted and high fault current is present. When the actuator 14 is in the closed latch position at point 68, and thus the contacts 24 and 28 of the vacuum interrupter 12 are closed, the fault current is detected by the recloser, and an automatic open command is given to the actuator 14 at point 70 that energizes the winding 42 and the actuator 14 begins opening at point 72, where the opening motion of the actuator 14 is performed along line portion 74. However, the high fault current has welded the contacts 24 and 28 closed, so that actuation of the actuator 14 may not actually separate the contacts 24 and 28. This attempted opening of the contacts 24 and 28 when they are welded shut is known in the industry as a hammer blow because the actuator 14 provides significant pressure to separate the contacts 24 and 28. The armature 40 is able to move some distance without separation of the contacts 24 and 28 because of the spring 38.

If the contacts 24 and 28 are welded shut and do not separate by the hammer blow, the actuator 14 is unable to continue to open at point 76 and remains at its current position as represented by line portion 78. The high fault current is still occurring and thus the weld is detected from that current by the recloser at point 80. When the weld is detected, the actuator 14 is automatically commanded closed at point 84 by energizing the winding 42, where the actuator 14 begins closing at point 86 and the armature 40 moves upward and continues its closing operation along line portion 88 to its closed latch position at point 90. By closing the actuator 14 it is reset for another hammer blow. Another open command is given to the actuator 14 at point 92 to initiate a second hammer blow by the actuator 14, where the actuator 14 begins the opening motion at point 94 and opens along line portion 96 to the open latch position at point 98. By providing multiple hammer blows to the contacts 24 and 28, the likelihood that the weld will be broken between the contacts 24 and 26 is significantly increased.

In this illustration, the second hammer blow is successful, and the armature 40 moves to the open latch position along the line portion 96 to the point 98, where the contacts 24 and 28 are separated and not welded. If the second hammer blow was not successful, then yet another closing and opening sequence of the actuator 14 can be initiated to try a third hammer blow to break the weld in the same manner as discussed above. As long as there is power available to open and close the actuator 14, the recloser will continue to try and break the weld in this manner. If none of the hammer blows are successful, then eventually the upstream protection devices will take effect and the fault current will be removed.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for separating welded contacts in a switch assembly, the method comprising:
   commanding an actuator to provide a hammer blow to open contacts of a switch;
   determining that the contacts are welded and did not open responsive to the hammer blow by detecting a continuity of current flow through the switch; and
   commanding the actuator to provide a second hammer blow.

2. The method according to claim 1 wherein the hammer blow comprises first commanding the actuator to close the contacts in the switch before commanding the actuator to open the contacts in the switch.

3. The method according to claim 1 wherein the hammer blow comprises mechanically actuating the actuator.

4. The method according to claim 1 wherein the actuator is an electro-magnetically actuated, and wherein commanding the contacts to open includes electro-magnetically actuating the actuator.

5. The method according to claim 4 wherein commanding the contacts to close includes electrically actuating the actuator.

6. The method according to claim 1 further comprising determining that the contacts are welded and did not open responsive to the second hammer blow by detecting a continuity of current flow through the switch; and
   commanding the actuator to provide a third hammer blow.

7. The method according to claim 1 wherein the switch is a single-phase self-powered magnetically actuated fault recloser for use in medium voltage power distribution network.

8. A single-phase, self-powered magnetically actuated fault interrupting switch for use in a medium voltage power distribution network, the switch comprising:
   a vacuum interrupter having a fixed contact and a moving contact, the moving contact coupled to an electro-magnetic actuator operable to drive the moving contact from an open position to a closed position and from the closed position to the open position;
   a sensor coupled to the vacuum interrupter, the sensor operable to provide a signal indicative of a fault condition;
   a controller coupled to the sensor and the electro-magnetic actuator, the controller being configured to provide a command signal to the electro-magnetic actuator to move the moving contact from the open position to the closed position and from the closed position to the open position;
   the controller being further configured responsive to the signal indicative of a fault condition to provide a command to the electro-magnetic actuator to open the moving contact via a hammer blow;
   the controller being further configured to determine that the fixed contact and the moving contact are welded together following the hammer blow based upon the signal indicative of a fault condition; and
   the controller being further configured responsive to the fixed contact and the moving contact being welded together to command the electro-magnetic actuator to open the moving contact via a second hammer blow.

9. The switch of claim 8, wherein the controller being further configured to determine that the fixed contact and the moving contact are welded together following the second hammer blow based upon the signal indicative of a fault condition; and
   the controller being further configured responsive to the fixed contact and the moving contact being welded together to command the electro-magnetic actuator to open the moving contact via a third hammer blow.

* * * * *